United States Patent
Chang et al.

(10) Patent No.: US 10,515,813 B2
(45) Date of Patent: Dec. 24, 2019

(54) MECHANISMS FOR ETCHING APPARATUS AND ETCHING-DETECTION METHOD

(71) Applicant: Taiwan Semiconductor Manufacturing Co., Ltd., Hsin-Chu (TW)

(72) Inventors: Chi-Wei Chang, Baoshan Township, Hsinchu County (TW); Ping-Ling Fan, Zhudong Township, Hsinchu County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 516 days.

(21) Appl. No.: 14/101,565

(22) Filed: Dec. 10, 2013

(65) Prior Publication Data
US 2015/0162227 A1 Jun. 11, 2015

(51) Int. Cl.
*H01J 37/32* (2006.01)
*H01L 21/3065* (2006.01)

(52) U.S. Cl.
CPC ...... *H01L 21/3065* (2013.01); *H01J 37/3244* (2013.01); *H01J 37/32091* (2013.01); *H01J 37/32963* (2013.01); *H01J 2237/334* (2013.01)

(58) Field of Classification Search
CPC ......... H01L 21/67253; H01L 21/67069; H01L 22/26; H01L 21/3065; H01J 37/32091; H01J 37/3244; H01J 37/32963; H01J 2237/334

See application file for complete search history.

(56) References Cited

U.S. PATENT DOCUMENTS

| | | | | |
|---|---|---|---|---|
| 4,948,458 | A * | 8/1990 | Ogle | H05H 1/46 118/50.1 |
| 6,159,297 | A * | 12/2000 | Herchen | H01J 37/3244 118/708 |
| 6,863,020 | B2 * | 3/2005 | Mitrovic | H01J 37/32082 118/723 E |
| 2003/0038112 | A1 * | 2/2003 | Liu | C23C 16/509 216/60 |
| 2003/0079983 | A1 * | 5/2003 | Long | H01J 37/32082 204/164 |
| 2005/0034811 | A1 * | 2/2005 | Mahoney | H01J 37/32954 156/345.24 |
| 2006/0021568 | A1 * | 2/2006 | Matsumoto | C23C 16/455 118/62 |

(Continued)

FOREIGN PATENT DOCUMENTS

JP 05136098 A * 6/1993
JP 2008251866 A * 10/2008

*Primary Examiner* — Yuechuan Yu
(74) *Attorney, Agent, or Firm* — McClure, Qualey & Rodack, LLP

(57) ABSTRACT

Embodiments of mechanisms of an etching apparatus are provided. The etching apparatus includes a processing chamber. The etching apparatus also includes a gas distribution plate disposed in the processing chamber and comprising a number of exhaust openings. The etching apparatus further includes a number of end-point detectors disposed on the gas distribution plate. The gas distribution plate is configured to spurt gas into the processing chamber via the exhaust openings during a semiconductor process.

20 Claims, 6 Drawing Sheets

(56) References Cited

U.S. PATENT DOCUMENTS

| | | | | |
|---|---|---|---|---|
| 2007/0131354 A1* | 6/2007 | Yokogawa | ........ | H01J 37/32935 156/345.34 |
| 2008/0223522 A1* | 9/2008 | Kobayashi | ........ | H01J 37/32091 156/345.25 |
| 2009/0186483 A1* | 7/2009 | Saito | ................ | H01J 37/32935 438/689 |
| 2013/0157387 A1* | 6/2013 | Chen | ................ | H01J 37/32963 438/5 |

* cited by examiner

MECHANISMS FOR ETCHING APPARATUS AND ETCHING-DETECTION METHOD

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

To selectively form processing layers in a desired location, the processing layers are often deposited, masked, and then etched in unmasked areas using a dry or plasma etch. To achieve good etching results, an end-point detector is located within an etching processing chamber. The end-point detector is configured to determine when an unmasked area of the processing layer is completely removed from the semiconductor substrate. This allows for complete removal of one processing layer without damaging an underlying processing layer.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. It is understood that additional operations can be provided before, during, and after the method, and some of the operations described can be replaced or eliminated for other embodiments of the method.

Semiconductor manufacturers have increased the size of semiconductor workpieces/wafers to improve processing capabilities and decrease the per unit cost of an integrated chip. As the size of semiconductor wafers increase, the size of processing chambers used for etching a semiconductor workpiece also increase. The increasing sizes of semiconductor workpieces and processing chambers result in problems for end-point detection (EPD) systems having a single site end-point detector within a processing chamber. For example, such end-point detection systems are unable to detect etching rate non-uniformities in the etching process, especially at wafer sizes of 450 mm. This is because the single-site end point detector cannot accurately detect the difference in end points at different locations within the process chamber. Etching non-uniformity causes etching rates to vary over a semiconductor workpiece and between semiconductor workpieces, resulting in the wafer loading effect.

Figure 1:
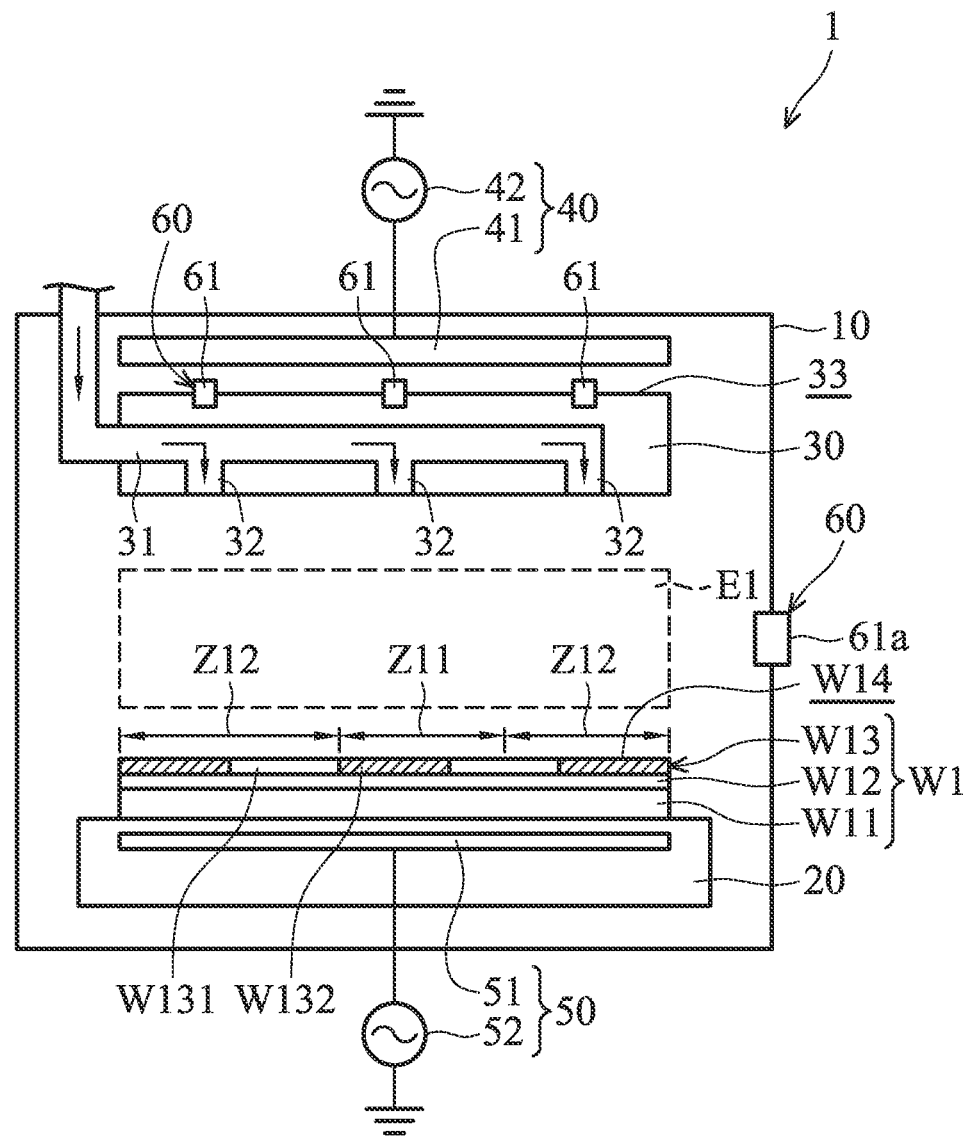
FIG. 1 is a schematic view of an etching apparatus in accordance with some embodiments of the disclosure.

Accordingly, embodiments of mechanisms for an etching apparatus are provided. The etching apparatus includes end-point detectors (EPDs) to detect different zones of a semiconductor workpiece that is etched according to a semiconductor process. For example, the semiconductor process is an etching process. FIG. 1 is a schematic view of an etching apparatus 1 in accordance with some embodiments of the disclosure. The etching apparatus 1 includes a processing chamber 10, a wafer chuck 20, a gas distribution plate 30, a first radio frequency device 40, a second radio frequency device 50, and an end-point detection system 60.

In some embodiments, the processing chamber 10 is held at a pressure in a range of about 10 mTorr to about 100 mTorr. The wafer chuck 20 is disposed in the processing chamber 10. The wafer chuck 20 is configured to hold a semiconductor workpiece W1 to be etched. The semiconductor workpiece W1 is 200 mm or 450 mm in size, for example.

The gas distribution plate 30 is configured to spurt gas into the processing chamber 10 during a semiconductor process. The gas distribution plate 30 is located over the wafer chuck 20. In some embodiments, the size of the gas distribution plate 30 corresponds to the size of the semiconductor workpiece W1. The gas distribution plate 30 is made of quartz. In some embodiments, the wafer chuck 20, the gas distribution plate 30, and the semiconductor workpiece W1 are parallel to each other.

The gas distribution plate 30 has a channel 31, and exhaust openings 32 communicate with the channel 31. The exhaust openings 32 face the wafer chuck 20. A gas is transmitted to the channel 31, and flows through the processing chamber 10 via the exhaust openings 32. In some embodiments, the gas includes $CF_4$, $CHF_3$, $C_2F_6$, $SF_6$, $O_2$, $N_2$, or Ar.

The first radio frequency device 40 is located over the gas distribution plate 30. The first radio frequency device 40 is configured to generate an electric field in the processing chamber 10. The first radio frequency device 40 includes a first electrode 41 and a first radio frequency power element 42. The first electrode 41 is located over the gas distribution plate 30. In some embodiments, the size of the first electrode 41 corresponds to the size of the gas distribution plate 30 and/or the semiconductor workpiece W1. The first radio frequency power element 42 is coupled with the first electrode 41. The first radio frequency power element 42 provides radio frequency energy to the first electrode 41.

The second radio frequency device 50 is connected to the wafer chuck 20. The second radio frequency device 50 is configured to generate an electric field in the processing chamber 10. In other words, the electric field is generated by the first radio frequency device 40 and the second radio frequency device 50. The second radio frequency device 50 includes a second electrode 51 and a second radio frequency power element 52. The second electrode 51 is located at the wafer chuck 20. In some embodiments, the size of the second electrode 51 corresponds to the size of the first electrode 41. The second radio frequency power element 52 is coupled with the second electrode 51. The second radio frequency power element 52 provides radio frequency energy to the second electrode 51.

During the etching process, the semiconductor workpiece W1 is disposed on the wafer chuck 20. In some embodiments, the semiconductor workpiece W1 includes a substrate W11, an etch-stop layer W12 and a processing layer W13. The substrate W11 is a wafer. The etch-stop layer W12 is overlaid on the substrate W11. The processing layer W13 is a photoresist layer. The photoresist layer W13 is overlaid on the etch-stop layer W12. The processing layer W13 includes unmasked areas W131 and masked areas W132.

Afterwards, the gas is spurted into the processing chamber 10 via the exhaust openings 32. The first radio frequency device 40 and the second radio frequency device 50 are enabled, and an electric field is generated between the first electrode 41 and the second electrode 51. Since the semiconductor workpiece W1 is located between the first electrode 41 and the second electrode 51, the semiconductor workpiece W1 is within the electric field. The etching plasma E1 is generated within the processing chamber 10 by the gas and the electric field during the etching process. The etching plasma E1 is configured to etch unmasked areas W131 of the semiconductor workpiece W1.

In general, the etching plasma E1 generates different spectral color depending on the etching degree of the processing layer W13 during the etching process, since different chemical materials are brought into the etching plasma E1. For example, when a portion of the unmasked areas W131 of the processing layer W13 is etched by the etching plasma E1, some of the chemical materials of the processing layer W13 are brought into the etching plasma E1. The different chemical materials emit different wavelengths in the etching plasma E1, and therefore the spectral color of the etching plasma E1 is changed. When the processing layer W13 is further etched, the amount of the chemical materials brought into the etching plasma E1 is increased, and the spectral color of the etching plasma E1 is different from the spectral color of the etching plasma E1 at the beginning of the etching process. Therefore, the etching degree of the processing layer W13 is determined according to the spectral color of the etching plasma E1.

Furthermore, when the etch-stop layer W12 is etched, the chemical materials of the etch-stop layer W12 are brought into the etching plasma E1. The spectral color of the etching plasma E1 is also changed by the chemical materials of the etch-stop layer W12. In addition, the end point of the etching process is defined as the unmasked areas W131 is substantially completely removed or the etch-stop layer W12 is etched. Therefore, the end point of the etching process is determined according to the spectral color of the etching plasma E1.

Figure 2:
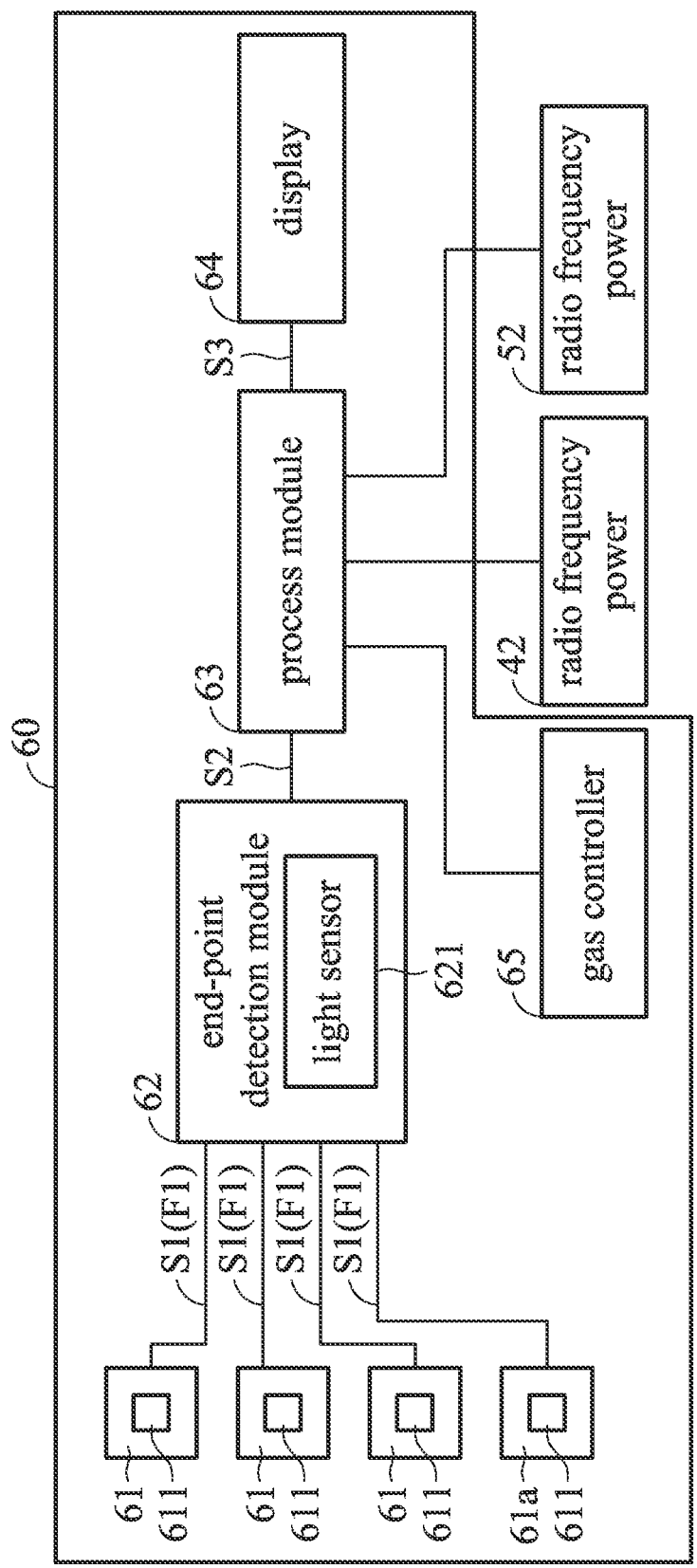
FIG. 2 is a function block diagram of an end-point detection system in accordance with some embodiments of the disclosure.

FIG. 2 is a function block diagram of the end-point detection system 60 in accordance with some embodiments of the disclosure. The end-point detection system 60 is connected to the processing chamber 10. The end-point detection system 60 is configured to detect the etching degree of the processing layer W13 and the end point of the etching process.

As shown in FIGS. 1 and 2, the end-point detection system 60 includes end-point detectors 61, an end-point detection module 62, a process module 63, a display 64, and a gas controller 65.

The end-point detectors 61 are disposed on a top surface 33 of the gas distribution plate 30. Furthermore, the end-point detectors 61 are located between the first electrode 41 and the gas distribution plate 30. In some embodiments, a portion of each of the end-point detectors 61 is embedded in the gas distribution plate 30, and passes through the top surface 33. In some embodiments, the whole of each of the end-point detectors 61 is embedded in the gas distribution plate 30. The end-point detectors 61 generate detecting signals S1 by detecting the spectral color of the etching plasma E1.

In some embodiments, the end-point detection system 60 further includes a side end-point detector 61a disposed on a wall on the processing chamber 10. The side end-point detector 61a is configured to detect the general spectral color of the etching plasma E1 in the processing chamber 10.

The end-point detection module 62 is coupled with each of the end-point detectors 61. The end-point detection module 62 receives the detecting signals S1 and generates spectral-color signals S2 according to each of the detecting signals S1. The process module 63 is coupled with the end-point detection module 62. The process module 63 receives the spectral-color signals S2 and generates etching-degree signals S3 according to the spectral-color signals S2.

The display 64 is coupled with the process module 63, and is configured to display the etching-degree signals S3. The gas controller 65 is coupled with the process module 63 and the channel 31. The gas controller 65 is configured to control the flow rate of the gas in the channel 31. In some embodiments, the process module 63 controls the gas controller 65 to adjust the flow rate of the gas in the channel 31 according to the etching-degree signals S3.

In some embodiments, the first radio frequency power element 42 and the second radio frequency power element 52 are coupled with the process module 63. The process module 63 controls the first radio frequency power element 42 and the second radio frequency power element 52 to adjust the radio frequency power provided to the first electrode 41 and the second electrode 51.

In some embodiments, each of the end-point detectors 61 includes a light filter 611. The end-point detection module 62 is connected to the end-point detectors 61 with fibers F1. The end-point detection module 62 includes a light sensor 621, such as CMOS (Complementary metal oxide semiconductor) sensor or a CCD (Charge-coupled Device) sensor. In some embodiments, the light of the etching plasma E1 passes through the light filter 611, and transmits to the light sensor 621. The spectral-color signals S2 is generated according to the light emitted on the light sensor 621, and therefore, the spectral-color signals S2 corresponds to the spectral color of the etching plasma E1.

In some embodiments, the process module 63 is a computer. The process module 63 determines the etching degrees and the end point of the processing layer W13 to generate the etching-degree signals S3 according to the spectral-color signals S2.

Figure 3:
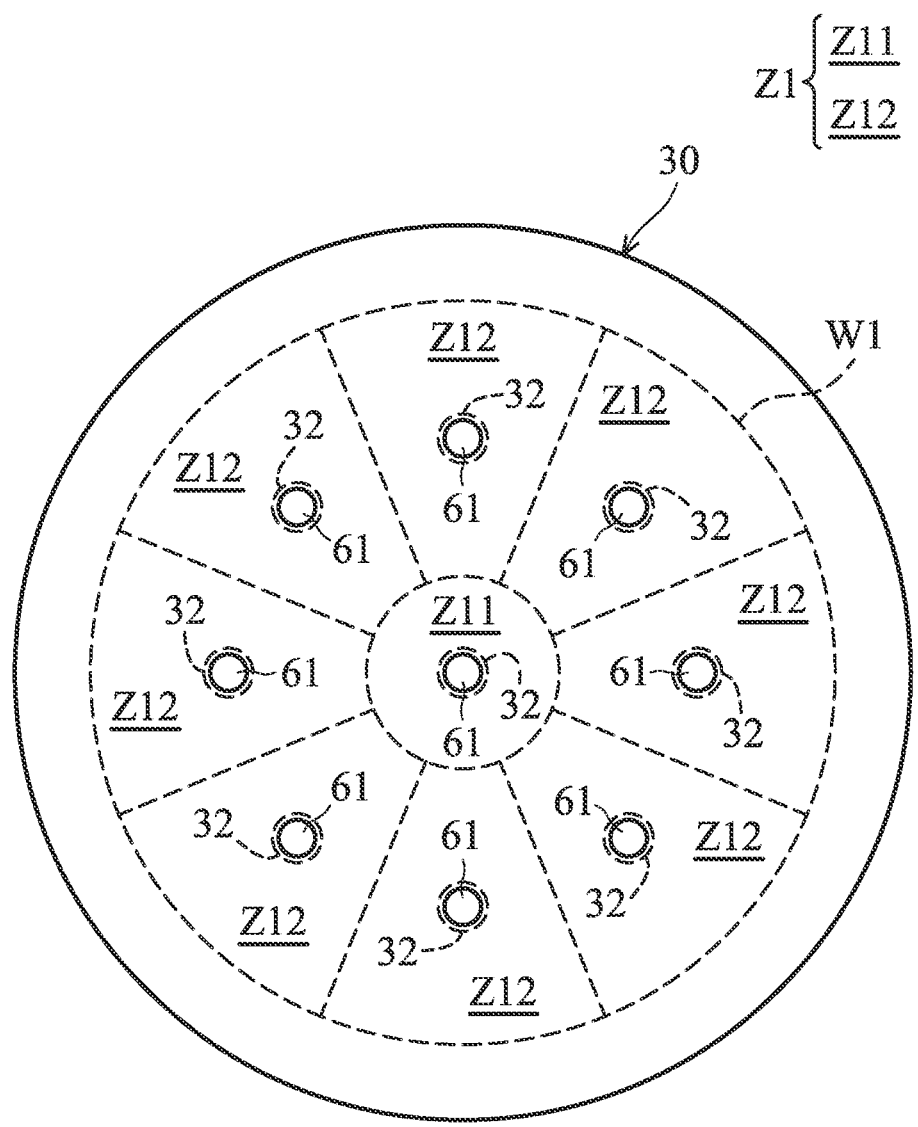
FIG. 3 is a top view of a gas distribution plate, end-point detectors, and a semiconductor workpiece in accordance with some embodiments of the disclosure.

FIG. 3 is a top view of the gas distribution plate 30, the end-point detectors 61, and the semiconductor workpiece W1 in accordance with some embodiments of the disclosure. The semiconductor workpiece W1 is a circular disk. The semiconductor workpiece W1 has an etching surface W14 (as shown in FIG. 1) and a number of zones Z1. In some embodiments, the zones Z1 include a central zone Z11 and peripheral zones Z12 on the etching surface W14. The central zone Z11 is located at the center of the semiconductor workpiece W1. The peripheral zones Z12 are around the central zone Z11. The areas of the peripheral zones Z12 are substantially the same. In some embodiments, the areas of the central zone Z11 and the peripheral zones Z12 are substantially the same. The central zone Z11 has a circular shape. Each of the peripheral zones Z12 has a fan shape.

The gas distribution plate 30 is a circular disk. In some embodiments, the end-point detectors 61 are arranged on the gas distribution plate 30 in an array. Each of the end-point detectors 61 corresponds to one of the zones Z1. Therefore, the etching degrees of each of different zones Z1 of the semiconductor workpiece W1 are able to be determined by the end-point detectors 61.

As shown in FIGS. 1 and 3, the end-point detectors 61 respectively face the exhaust openings 32. Therefore, the light generated by the etching plasma E1 is clearly detected by the end-point detectors 61 via the exhaust openings 32. Further, the end-point detectors 61 are also arranged on the gas distribution plate 30 in an array. Each of the exhaust openings 32 also corresponds to one of the zones Z1. The etching rates of the central zone Z11 and the peripheral zones Z12 is relative to the flow rate of the gas exhausted from the corresponding exhaust openings 32.

Figure 4:
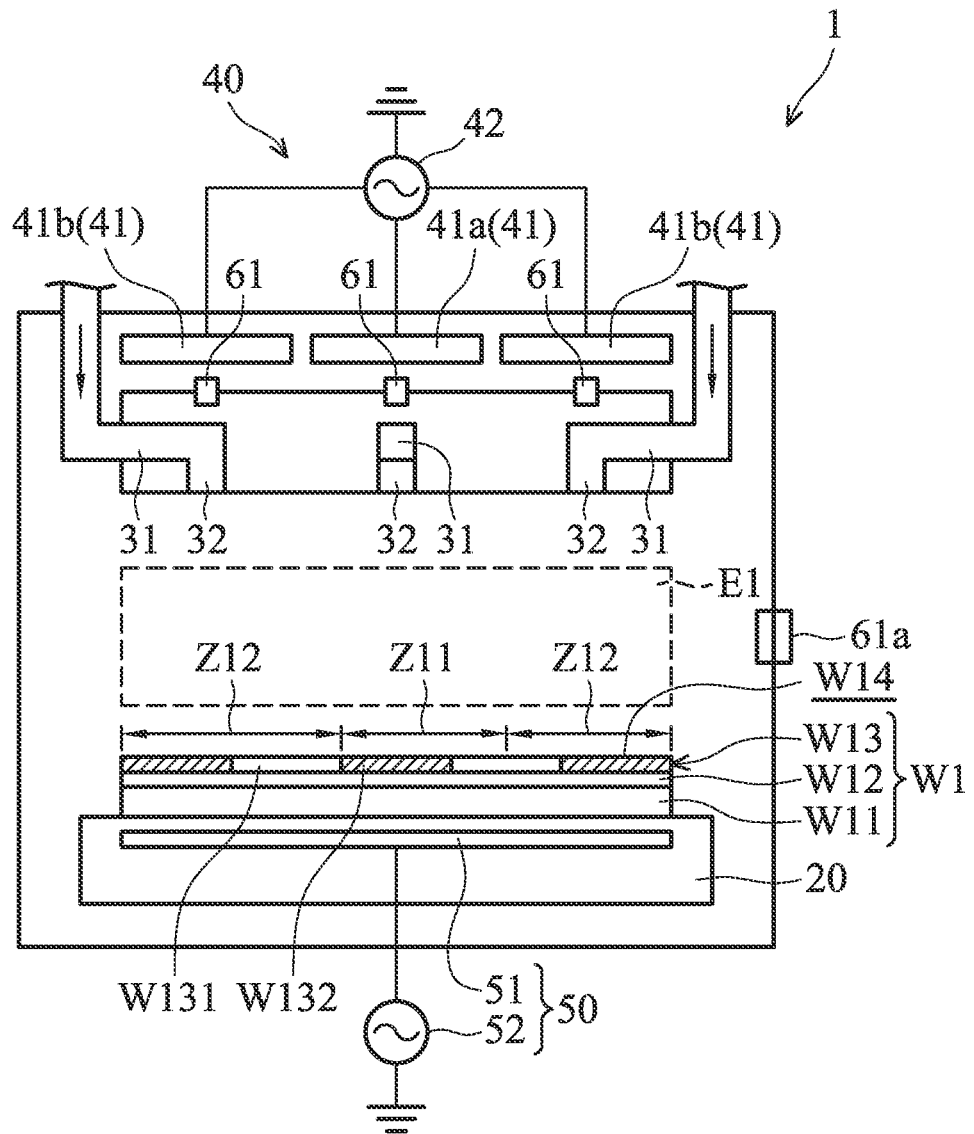
FIG. 4 is a schematic view of an etching apparatus in accordance with some embodiments of the disclosure.

FIG. 4 is a schematic view of an etching apparatus 1 in accordance with some embodiments of the disclosure. The gas distribution plate 30 includes a number of channels 31 communicating with each of the exhaust openings 32. Therefore, each of the flow rates of the gas exhausted from different exhaust openings 32 is able to be adjusted by the gas controller 65.

The first radio frequency device 40 includes a number of first electrodes 41. Each of the first electrodes 41 is coupled with the first radio frequency power element 42. The first radio frequency power element 42 may provide different radio frequency energy to the first electrodes 41. Each of the first electrodes 41 faces one of end-point detectors 61. In other words, the first electrodes 41 respectively correspond to the different zones Z1 of the semiconductor workpiece W1.

Figure 5:
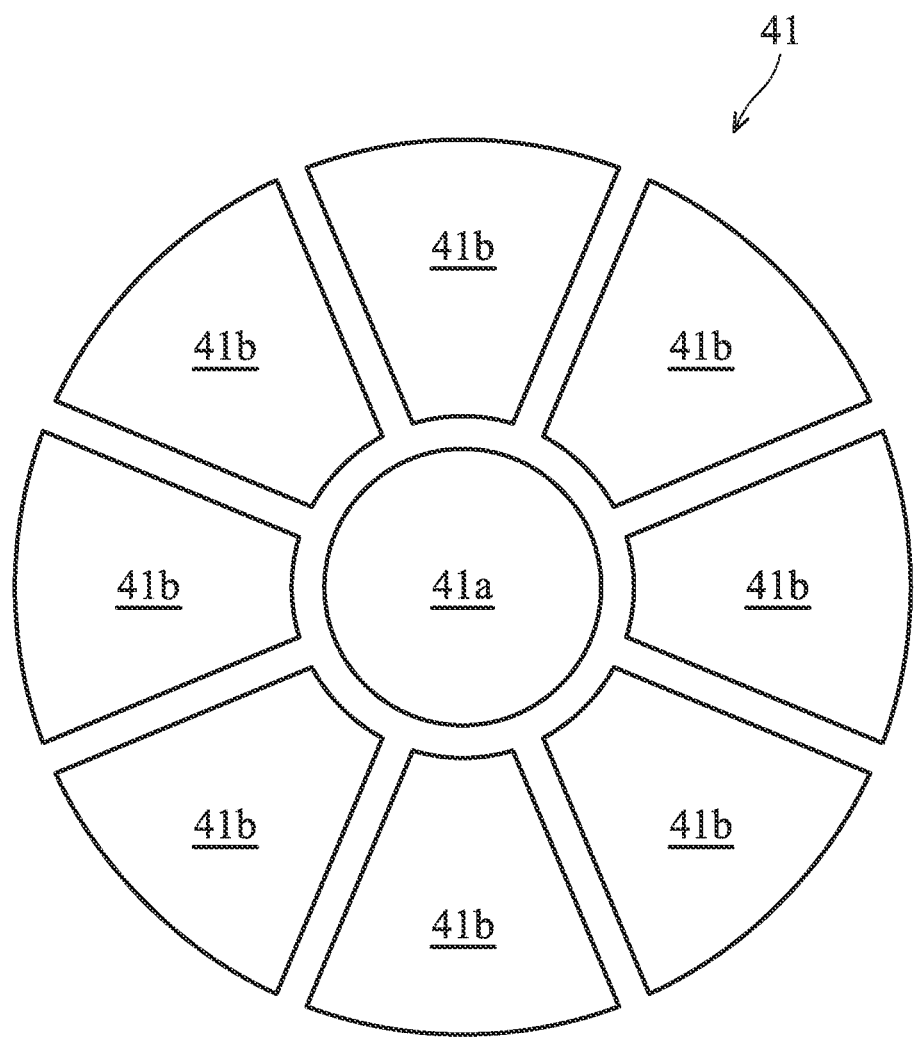
FIG. 5 is a top view of first electrodes relative to FIG. 4 in accordance with some embodiments of the disclosure.

FIG. 5 is a top view of the first electrodes 41 relative to FIG. 4 in accordance with some embodiments of the disclosure. As shown in FIG. 5, the first electrodes 41 include a central electrode 41a and a number of peripheral electrodes 41b. The peripheral electrodes 41b are around the central electrode 41a. The areas of the peripheral electrodes 41b are substantially the same. In some embodiments, the areas of the central electrode 41a and the peripheral electrodes 41b are substantially the same. The central electrode 41a has a circular shape. Each of the peripheral electrodes 41b has a fan shape.

Figure 6:
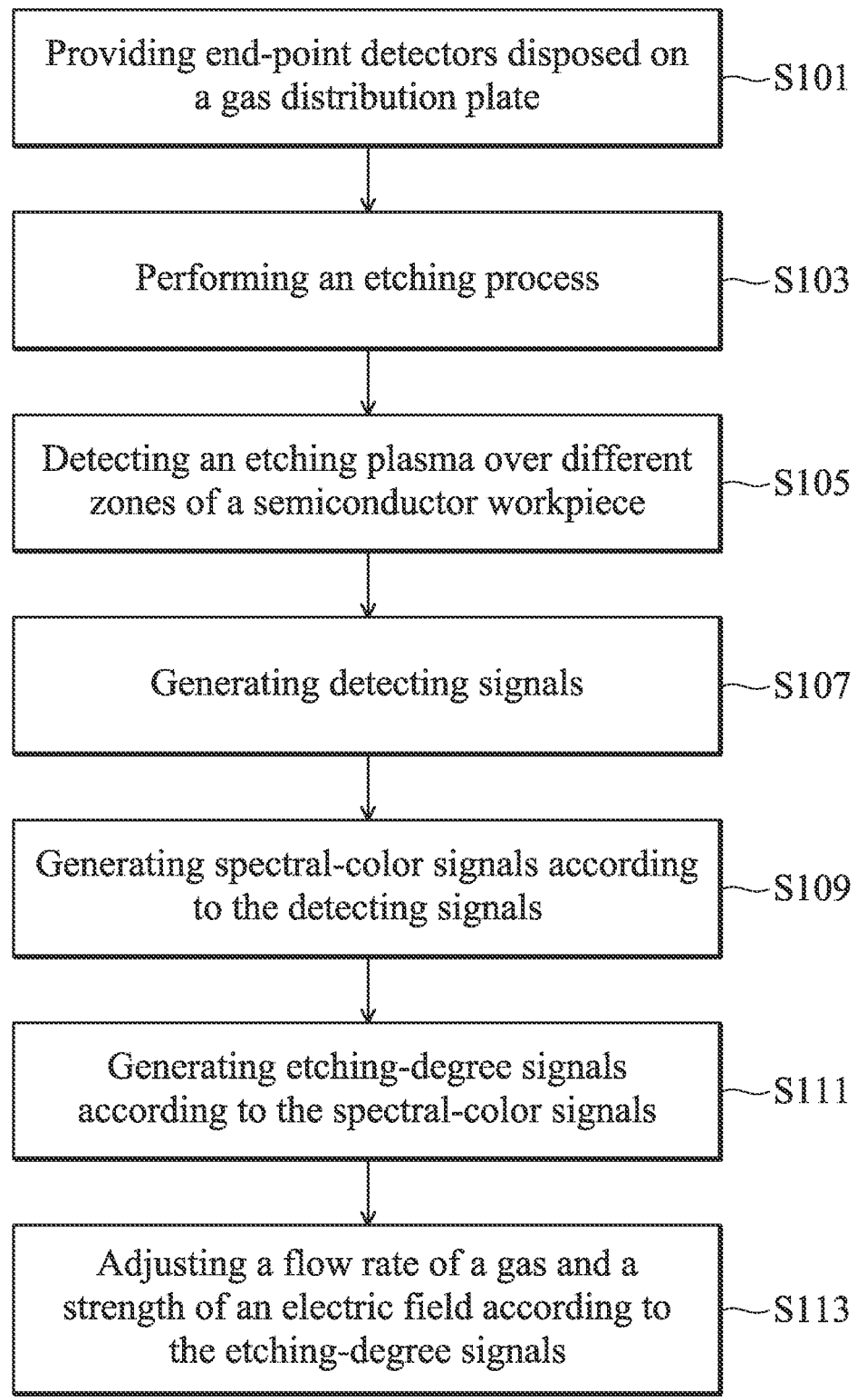
FIG. 6 is a flow chart of an etching-detection method in accordance with some embodiments of the disclosure.

FIG. 6 is a flow chart of an etching-detection method in accordance with some embodiments of the disclosure. In step 101, the etching apparatus 1 is provided. The end-point detectors 61 are disposed on the gas distribution plate 30.

In step 103, an etching process is performed on a semiconductor workpiece W1. Each of the end-point detectors 61 is located over one of the zones Z1 of the semiconductor workpiece W1. The gas is spurted into the processing chamber 10 via the exhaust openings 32 of the gas distribution plate 30. The electric field is generated between the first electrode 41 and the second electrode 51. Furthermore, the etching plasma E1 is formed by the gas and the electric field, and the etching plasma E1 emits light.

In step 105, the end-point detectors 61 respectively detect the etching plasma E1 over the zones Z1. In step S107, the end-point detectors 61 generate detecting signals S1 according to the light of the etching plasma E1. In some embodiments, the end-point detectors 61 receive the light of the etching plasma E1 via the light filters 611. The filtered light is defined as the detecting signal S1. The filtered light is transmitted to the end-point detection module 62 via the light filters 611.

In step S109, the end-point detection module 62 generates the spectral-color signals S2 according to the detecting signals S1. In step S111, the process module 63 generates the etching-degree signals S3 according to the spectral-color signals S2. The spectral-color signals S2 correspond to the spectral color of the light of the etching plasma E1 over the different zones Z1 of the semiconductor workpiece W1.

Since each of the etching-degree signals S3 corresponds one of the zones Z1 of the semiconductor workpiece W1, the etching degrees of different zones Z1 of the semiconductor workpiece W1 are able to be determined.

In step S113, the flow rate of a gas exhausted from the gas distribution plate 30 in the processing chamber 10 is adjusted by the gas controller 65 according to the etching-degree signals S3. Furthermore, the electric field is adjusted by the first radio frequency power element 42 and the second radio frequency power element 52 according to the etching-degree signals S3. Therefore, the etching rate of the processing layer W13 is able to be controlled.

In some embodiments, as shown in FIG. 3, the flow rates of the gas exhausted from different exhaust openings 32 are able to be respectively adjusted by the gas controller 65. Furthermore, the electric fields generated by different first electrodes 41 are able to be respectively adjusted by the first radio frequency power element 42. Therefore, the etching rates of different zones Z1 are able to be controlled.

For example, as shown in FIGS. 3 and 4, the unmasked area W131 in the peripheral zones Z12 is etched to the end point, but the central zone Z11 is not etched to the end point during the etching processes. The flow rates of the gas exhausted from the exhaust opening 32 corresponding to the central zone Z11 may be increased by the gas controller 65 according to the etching-degree signal S3, which corresponding to the central zone Z11. Therefore, the etching rate of the central zone Z11 is increased. In addition, the electric field generated by the first electrodes 41 corresponding to the central zone Z11 may be increased by the first radio frequency power element 42, and therefore the etching rate of the central zone Z11 is further increased.

Embodiments of mechanisms for an etching apparatus are provided. The etching degrees and the end points of different zones of a semiconductor workpiece are detected by a number of end-point detectors. Therefore, the etching process is well controlled and good etching results are achieved according to the detections of the end-point detectors. The etching rates of the different zones of the semiconductor workpiece are adjustable by a radio frequency device with a number of electrodes and/or a gas controller with a number of channels. Furthermore, the end-point detectors respectively face the exhaust openings. Therefore, the light generated by the etching plasma is clearly detected by the end-point detectors via the exhaust openings.

In some embodiments, an etching apparatus is provided. The etching apparatus includes a processing chamber. The etching apparatus also includes a gas distribution plate disposed in the processing chamber and comprising a number of exhaust openings. The etching apparatus further includes a number of end-point detectors disposed on the gas distribution plate. The gas distribution plate is configured to spurt gas into the processing chamber via the exhaust openings during a semiconductor process.

In some embodiments, an etching apparatus is provided. The etching apparatus includes a processing chamber and a wafer chuck disposed in the processing chamber. The etching apparatus also includes a gas distribution plate located over the wafer chuck and comprising a number of exhaust openings facing the wafer chuck. The etching apparatus further includes a number of end-point detectors disposed on the gas distribution plate and facing the exhaust openings. The gas distribution plate is configured to spurt gas into the processing chamber via the exhaust openings during a semiconductor process. The end-point detectors respectively detect different areas of a semiconductor workpiece disposed on the wafer chuck during a semiconductor process.

In some embodiments, an etching-detection method is provided. The etching-detection method includes providing a plurality of end-point detectors disposed on a gas distribution plate. The etching-detection method also includes performing an etching process on a semiconductor workpiece, which has a number of zones. Each of the end-point detectors is located over one of the zones. The etching-detection method further includes detecting etching plasma over the zones by the end-point detectors and generating a plurality of detecting signals by the end-point detectors.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An etching apparatus, comprising: a processing chamber; a gas distribution plate, disposed in the processing chamber, wherein a channel is formed in the gas distribution plate and a plurality of exhaust openings formed on the gas distribution plate and communicates with the channel; a plurality of end-point detectors, disposed on the gas distribution plate, located over and aligned with the exhaust openings, wherein each of the end-point detectors is separated from the channel by the gas distribution plate; and a radio frequency device, located over the gas distribution plate, comprising a center electrode and a plurality of peripheral electrodes disposed between and separated from an upper wall of the processing chamber and the end-point detectors; wherein the peripheral electrodes are around the center electrode, each of the peripheral electrodes and the center electrode are located over and aligned with one of the end-point detectors in a vertical direction, and each of the end-point detectors is aligned with one of the exhaust openings in the vertical direction, wherein the gas distribution plate is configured to spurt gas into the processing chamber via the channel and the exhaust openings during a semiconductor process, wherein the gas distribution plate is not directly connected to the radio frequency device, wherein the radio frequency device comprises a radio frequency power element coupled with the center electrode and the peripheral electrodes.

2. The etching apparatus as claimed in claim 1, wherein the end-point detectors respectively face the exhaust openings, and each of the end-point detectors is aligned with one of the exhaust openings.

3. The etching apparatus as claimed in claim 1, further comprising:
   a wafer chuck located under the gas distribution plate; and
   a second radio frequency device coupled with the wafer chuck.

4. The etching apparatus as claimed in claim 1, further comprising an end-point detection module connected to the end-point detectors with a plurality of fibers, wherein the end-point detectors receive a light of an etching plasma formed by the gas.

5. The etching apparatus as claimed in claim 1, further comprising a side end-point detector disposed on a wall of the processing chamber.

6. The etching apparatus as claimed in claim 1, wherein the electrode is configured to generate an electric field, an etching plasma is generated within the processing chamber by the gas and the electric field during the semiconductor process, and the end-point detectors are configured to generate detecting signals by detecting the etching plasma.

7. The etching apparatus as claimed in claim 1, wherein each of the end-point detectors is separated from the channel by the gas distribution plate in a direction along which the corresponding end-point detector is aligned with one of the exhaust openings.

8. The etching apparatus as claimed in claim 1, wherein a portion of gas distribution plate that separates the channel and the end-point detectors is made of quartz.

9. The etching apparatus as claimed in claim 1, wherein the areas of the fan-shaped peripheral zones and the central zone are substantially the same.

10. The etching apparatus as claimed in claim 1, wherein the end-point detectors and the exhaust openings are arranged to correspond to a central zone and a plurality of fan-shaped peripheral zones of the gas distribution plate disposed in the processing chamber, and the fan-shaped peripheral zones are around the central zone and each have one of the end-point detectors and one of the exhaust openings therein,
> wherein the center electrode is located over the central zone, and each of the peripheral electrodes are located over one of the fan-shaped peripheral zones,
> wherein a radial distance between each of the end-point detectors and a center of the gas distribution plate is the same.

11. The etching apparatus as claimed in claim 10, wherein a size of the end-point detector is smaller than a size of the exhaust opening.

12. An etching apparatus, comprising: a processing chamber; a wafer chuck disposed in the processing chamber; a gas distribution plate, located over the wafer chuck, wherein a channel is formed in the gas distribution plate and a plurality of exhaust openings communicate with the channel and face the wafer chuck; a plurality of end-point detectors, disposed on the gas distribution plate, respectively facing the exhaust openings, wherein the end-point detectors are located over and aligned with the exhaust openings, and each of the end-point detectors is separated from the channel by the gas distribution plate; and a radio frequency device, located over the gas distribution plate, comprising a center electrode and a plurality of peripheral electrodes disposed between and separated from an upper wall of the processing chamber and the end-point detectors; wherein the gas distribution plate is not directly connected to the radio frequency device, the peripheral electrodes are around the center electrode, and the areas of the center electrode and the peripheral electrodes are substantially the same, wherein the gas distribution plate is configured to spurt gas into the processing chamber via the channel and the exhaust openings, and the end-point detectors detect respectively different areas of a semiconductor workpiece disposed on the wafer chuck during a semiconductor process, wherein the radio frequency device comprises a radio frequency power element coupled with the center electrode and the peripheral electrodes.

13. The etching apparatus as claimed in claim 12, wherein the end-point detectors are arranged on the gas distribution plate in an array.

14. The etching apparatus as claimed in claim 12, further comprising a second radio frequency device coupled with the wafer chuck.

15. The etching apparatus as claimed in claim 12, further comprising an end-point detection module connected to the end-point detectors with a plurality of fibers, wherein the end-point detectors receive a light of an etching plasma formed by the gas.

16. The etching apparatus as claimed in claim 12, wherein the electrode is configured to generate an electric field, an etching plasma is generated within the processing chamber by the gas and the electric field during the semiconductor process, and the end-point detectors are configured to generate detecting signals by detecting spectral colors of the etching plasma over different areas of the semiconductor workpiece,
> wherein a radial distance between each of the end-point detectors and a center of the gas distribution plate is the same.

17. The etching apparatus as claimed in claim 16, wherein a size of the end-point detector is smaller than a size of the exhaust opening.

18. An etching apparatus, comprising: a processing chamber; a wafer chuck disposed in the processing chamber; a gas distribution plate, located over the wafer chuck, wherein a plurality of channels are formed in the gas distribution plate and a plurality of exhaust openings which each communicate with one of the channels and face the wafer chuck; a plurality of end-point detectors, embedded in the gas distribution plate, respectively facing the exhaust openings, wherein the end-point detectors are located over and aligned with the exhaust openings; and a radio frequency device, located over the gas distribution plate, comprising a center electrode and a plurality of peripheral electrodes disposed between and separated from an upper wall of the processing chamber and the end-point detectors; wherein the peripheral electrodes are around the center electrode, and the center electrode and the peripheral electrodes are each located over and aligned with one of the end-point detectors and one of the exhaust openings in a same direction, wherein the gas distribution plate is configured to spurt gas into the processing chamber via the channel and the exhaust openings, and the end-point detectors detect respectively different areas of a semiconductor workpiece disposed on the wafer chuck during a semiconductor process, wherein the gas distribution plate is not directly connected to the radio frequency device, wherein the radio frequency device comprises a radio frequency power element coupled with the center electrode and the peripheral electrodes.

19. The etching apparatus as claimed in claim 18, wherein an etching plasma is generated within the processing chamber by the gas, the etching plasma is configured to etch unmasked areas of a semiconductor workpiece, and the end-point detectors are configured to generate detecting signals by detecting the etching plasma,
> wherein an end-point detection module is coupled with each of the end-point detectors, receives the detecting signals and generates spectral-color signals according to the detecting signals, wherein each of the end-point detectors is separated from the channel by the gas distribution plate.

20. The etching apparatus as claimed in claim 19, wherein a process module is coupled with the end-point detection module, receives the spectral-color signals and generates etching-degree signals according to the spectral-color signals,
> wherein a gas controller coupled with the channel, and configured to adjust various flow rates of the gas exhausted from different exhaust openings, and the process module controls the gas controller to adjust the flow rates of the gas according to the etching-degree signals,
> wherein a radial distance between each of the end-point detectors and a center of the gas distribution plate is the same.

* * * * *